United States Patent
Micheloni et al.

(10) Patent No.: US 6,836,442 B2
(45) Date of Patent: Dec. 28, 2004

(54) NONVOLATILE MEMORY DEVICE HAVING A VOLTAGE BOOSTER WITH A DISCHARGE CIRCUIT ACTIVATED DURING STANDBY

(75) Inventors: Rino Micheloni, Turate (IT); Ilaria Motta, Cassolnovo (IT); Marco Capovilla, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/614,693

(22) Filed: Jul. 7, 2003

(65) Prior Publication Data

US 2004/0136242 A1 Jul. 15, 2004

(30) Foreign Application Priority Data

Jul. 5, 2002 (IT) .................................... MI2002A1486

(51) Int. Cl.[7] .............................................. G11C 5/14
(52) U.S. Cl. .................. 365/204; 365/189.09; 365/229; 365/189.07; 365/185.18; 327/537; 327/535; 327/538
(58) Field of Search ........................... 365/204, 189.09, 365/229, 226, 189.07, 185.18; 327/536, 537, 535, 538

(56) References Cited

U.S. PATENT DOCUMENTS

| 4,308,594 A | * | 12/1981 | Jiang ........................... 365/187 |
| 5,608,677 A | * | 3/1997 | Yoon et al. ............. 385/189.09 |
| 5,801,997 A | * | 9/1998 | Hsieh et al. ........... 365/189.11 |
| 6,067,336 A | * | 5/2000 | Peng .......................... 375/376 |

FOREIGN PATENT DOCUMENTS

EP            1113450 A1  *  7/2001       ........... G11C/16/30

* cited by examiner

Primary Examiner—Andrew Q. Tran
(74) Attorney, Agent, or Firm—Lisa K. Jorgenson; David V. Carlson; Seed IP Law Group PLLC

(57) ABSTRACT

A voltage booster device to selectively assume an active status and a stand-by status with a first terminal to assume a respective electric potential and associated to a first capacitor, a second terminal associated to a second capacitor and selectively connectable to the first terminal, and a discharge circuit for discharging the first capacitor thus reducing the electrical potential of the first terminal, the discharge circuit being activated when said device is in the stand-by status and the second terminal is disconnected from said first terminal.

22 Claims, 8 Drawing Sheets

NONVOLATILE MEMORY DEVICE HAVING A VOLTAGE BOOSTER WITH A DISCHARGE CIRCUIT ACTIVATED DURING STANDBY

FIELD OF THE INVENTION

The following invention relates to a voltage booster device of the type used in non-volatile memories.

BACKGROUND OF THE INVENTION

As is known, for non-volatile memories such as, in particular, multilevel Flash memories, it is necessary to have a higher voltage than the supply voltage commonly used not only in programming and deleting operations, but also for the operations of reading the content of the memory cells.

Therefore, unless one provides for the required voltages to be supplied from outside the integrated circuit on which the memory is created, they must be generated inside the integrated circuit itself; this is typically the case of a Single Power Supply circuit.

This calls for the need to use voltage booster devices, created in the same integrated circuit.

The voltage booster devices commonly used include boosters based on the charge pump principle. As is known, a charge pump booster behaves as a voltage generator with non-null output resistance, for which the current that can be requested of it is inversely proportionate to the voltage that it must supply.

Moreover, this type of booster does not make it possible to supply voltage with the necessary precision and, therefore, an adjustment circuit of the booster output voltage is conveniently used.

With the aim of reducing consumption, when operations are not being performed on the non-volatile memory the voltage booster device is deactivated or rather, it is taken to a wait or stand-by status.

To this ends, the document EP-A-1113450 describes a voltage booster device including, in addition to booster and a regulator, also a stand-by booster device to operate on the stand-by input. At the stand-by input, an output node of the booster and an output node of the voltage regulator are connected to one another and with an output terminal of the stand-by voltage booster device. This document describes that the stand-by booster device is used to supply to such nodes a voltage necessary to compensate the discharge due to junction leakage currents (inverse saturation currents) of the transistors connected to it. According to the abovementioned document, thanks to the action of this stand-by booster device it is possible, on exiting stand-by, to reach the reading voltage required quickly and accurately.

With particular reference to a voltage booster device used to supply the reading voltage of a cell of the type described in the document EP-A-1113450, phenomena of saturation of the voltage value of the output node of this device such as to vanquish the improvement action of the stand-by booster device or, even, such as to be able to cause an erroneous reading of cell content have been observed. Moreover, for this type of conventional device a strong dependence of its performance on the piloting signal times taken to bring the device itself to stand-by and in the active state has been detected.

BRIEF SUMMARY OF THE INVENTION

One aim of the present invention is to provide a voltage booster device that presents superior performances than those of the conventional devices described above.

The aim of the present invention is achieved by a voltage booster device as defined in the annexed claims 1 to 21.

Also object of the present invention is a memory system including a voltage booster device as defined in the annexed claim 22.

BRIEF DESCRIPTION OF THE SEVERAL VIEWS OF THE DRAWING(S)

Further characteristics and advantages of the invention will be made evident by the description that follows of a preferred embodiment and its variants supplied for an example with reference to the annexed drawings wherein:

FIG. 1 schematically illustrates a preferred embodiment of a non-volatile memory system in agreement with the invention, FIG. 2 schematically illustrates a preferred embodiment of a detection and discharge circuit that can be used in the system in FIG. 1;

FIG. 3 illustrates the pattern of certain command signals that can be used in said memory system;

FIG. 4 schematically illustrates a preferred embodiment of a voltage comparator that can be used in said system;

FIG. 5 schematically illustrates a preferred embodiment of means of commutation and of a booster element that can be used in said system;

Figure 8:
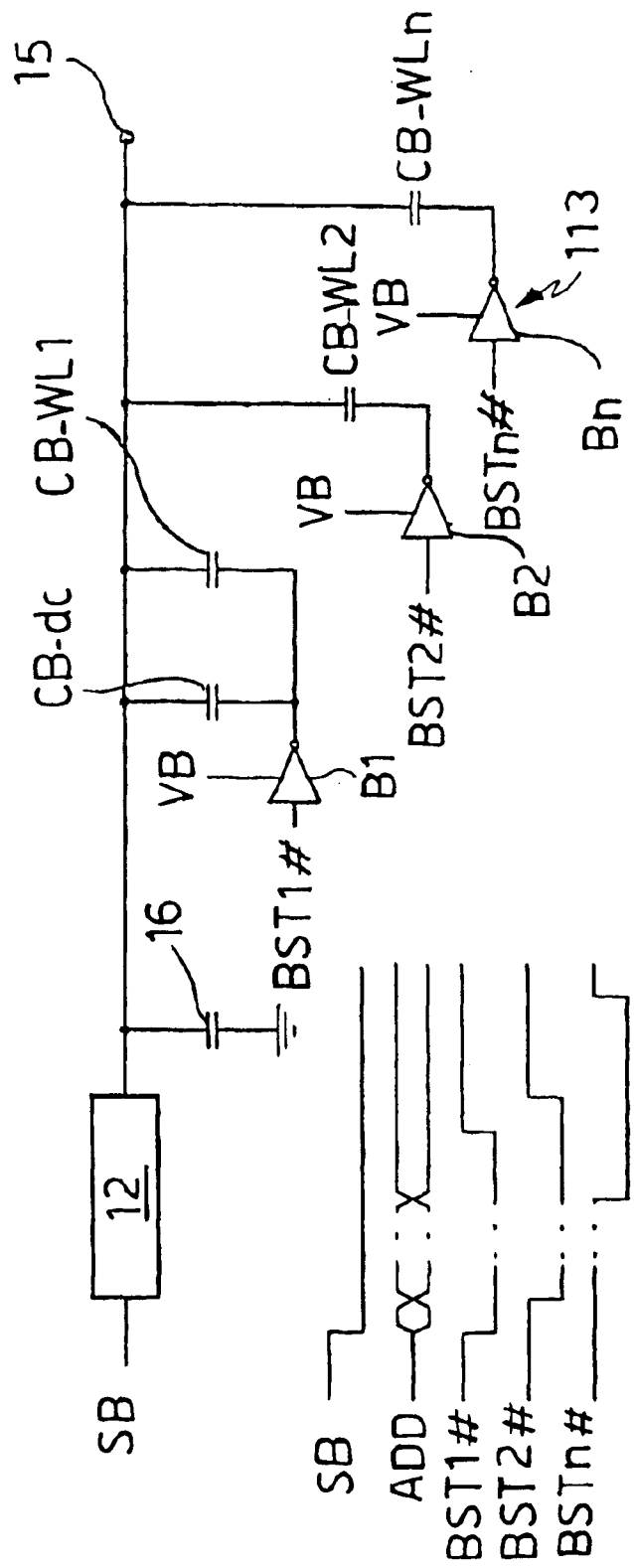
Figure 9A:
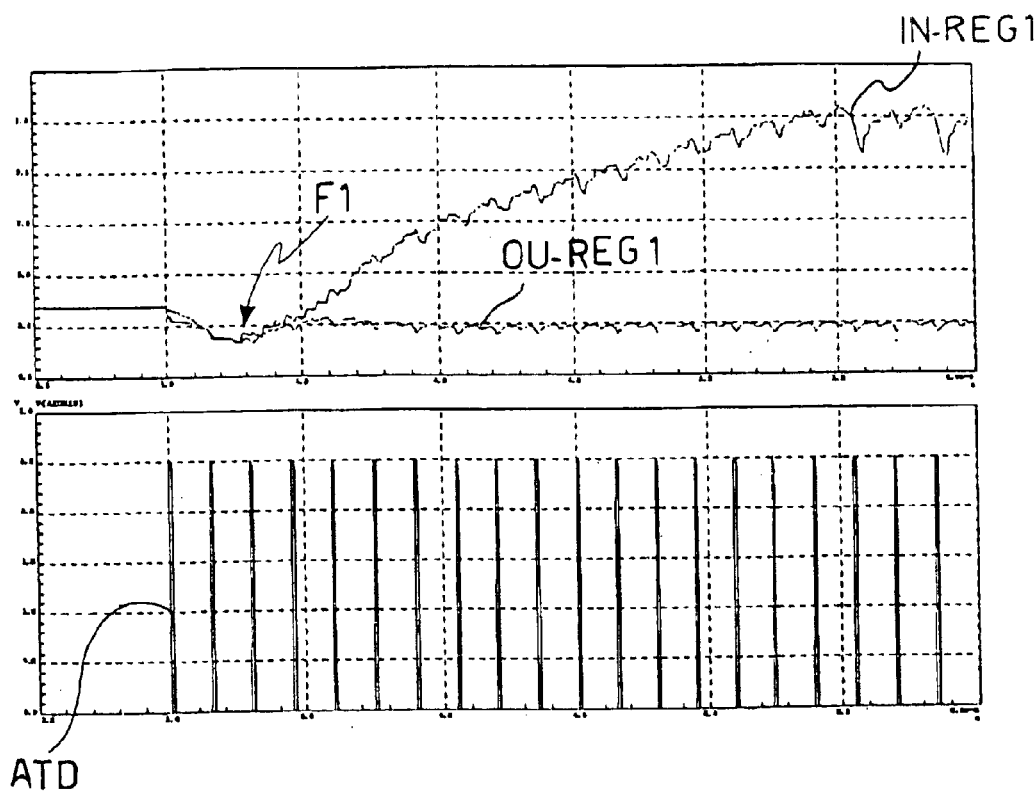
Figure 9B:
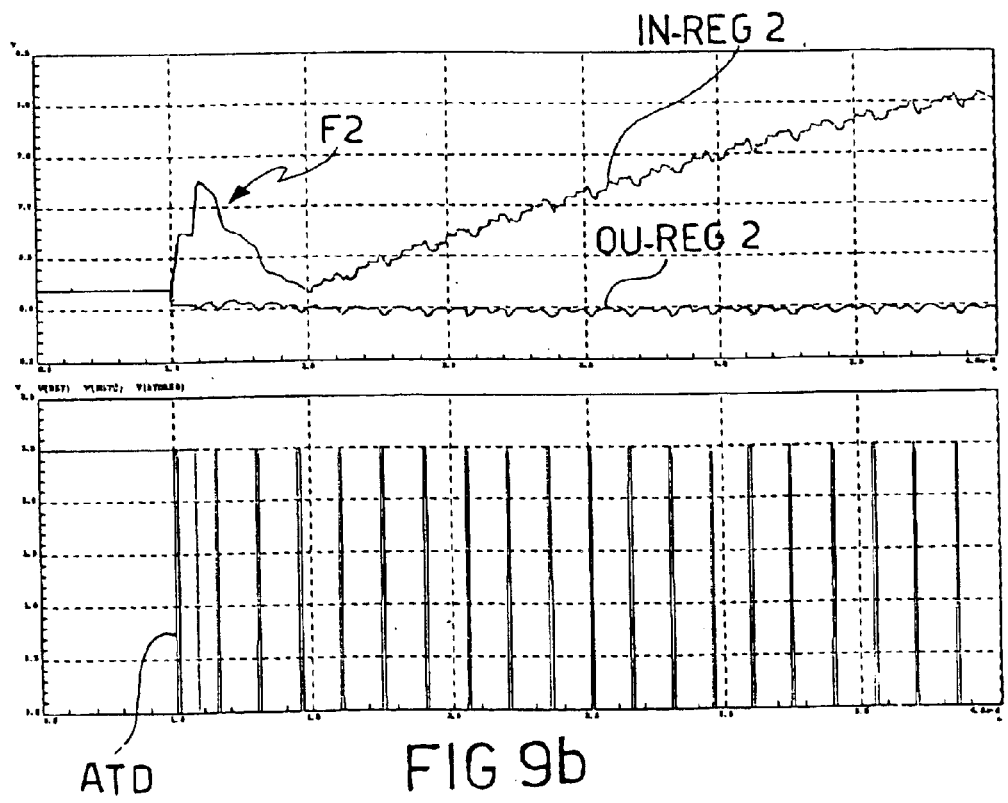

FIG. 8 schematically illustrates an example of an additional voltage booster device that can be used in said system according to a preferred embodiment of the present invention;

FIGS. 9a and 9b illustrate comparison simulations between a conventional booster element and one created in agreement with a preferred embodiment of the invention.

DETAILED DESCRIPTION OF THE INVENTION

Figure 1:
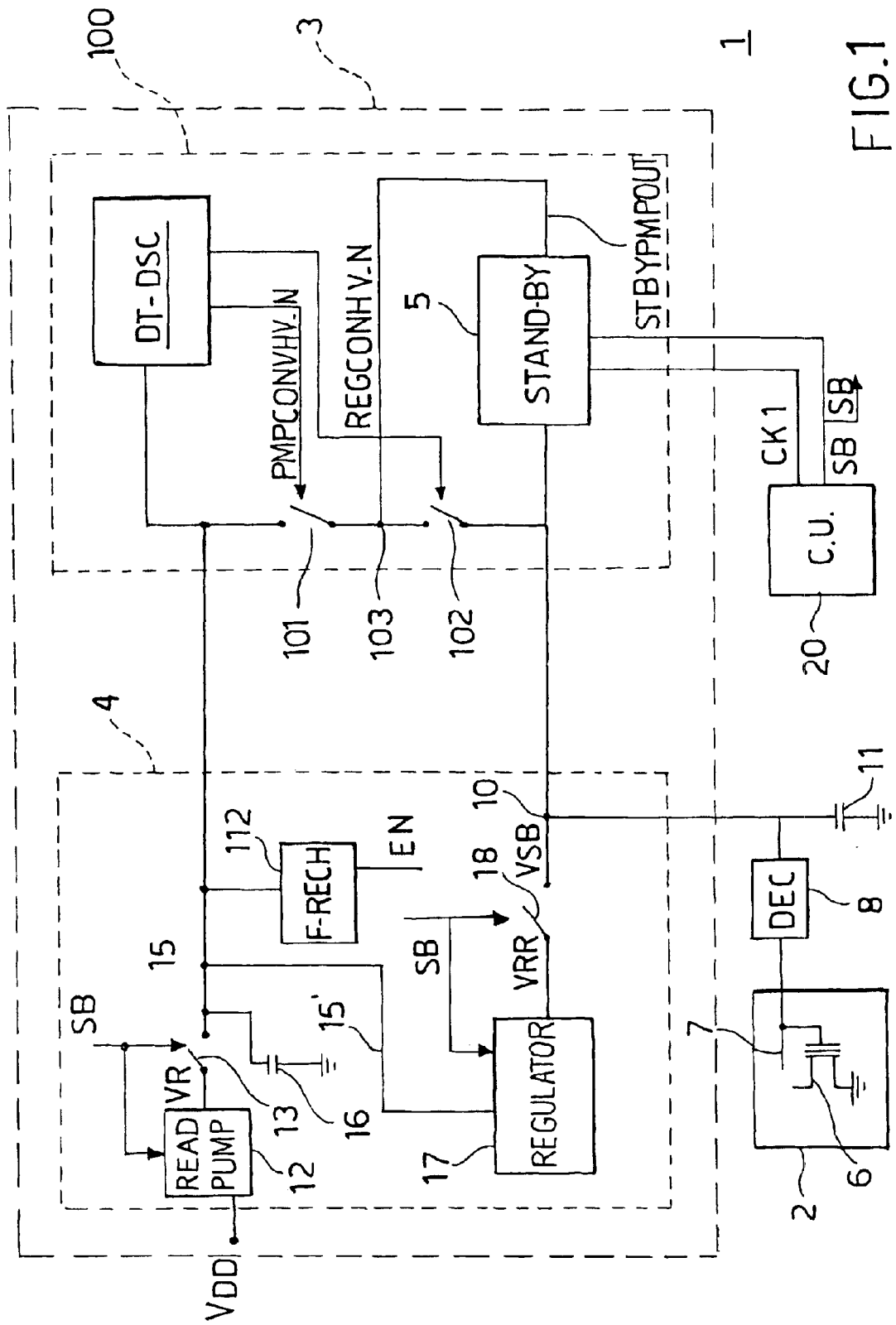

FIG. 1 illustrates a non-volatile memory system 1 comprising a matrix or a memory array 2, a voltage booster device 3 including a reading voltage booster stage 4, a wait or stand-by voltage booster stage (STAND-BY) 5 and circuital means of discharge management 100.

The memory array 2 is, for example, of the low supply voltage (for example equal to 3V) multi-level Flash type and comprises a plurality of memory cells 6 organized in rows and columns. In particular, the memory cells 6 belonging to the same row have their gate terminals connected to a row or word line 7.

A row decoder 8, for example, of the conventional type, selectively connects one of the memory array 2 word lines 7 to an output terminal 10 of the voltage booster device 3.

The row decoder 8 has a parasitic capacity represented in FIG. 1 by a decodification capacitor 11 connected between said output terminal 10 and the ground.

The reading voltage booster stage 4 is, for example, of a conventional type and comprises a reading positive charge pump booster 12 having an output terminal in order to make available a reading voltage VR connected by a first commutator 13 to a first node 15. Said reading voltage VR is suitably higher in module in relation to a supply voltage VDD of the memory system 1 and the booster 12.

The first branch line 15 can be selectively (or rather reversibly) connected to a first terminal of a filter capacitor 16 with capacity $C_{16}$ having a second terminal connected to the earth. The filter capacitor 16 has a function of filtering undesired components from the voltage at the first node 15 due to transients that occur following the switching on or off of the booster 12.

Moreover, the first node 15 is connected by a conduction line 15' to a reading voltage regulator input 17 provided with an output terminal in order to supply a regulated reading voltage VRR. The reading voltage regulator output terminal 17 is selectively connectable to the output terminal 10 of the voltage booster device 3 by a second commutator 18.

Moreover, the memory system 1 comprises a control unit (C.U.) 20 in order to generate a wait or stand-by signal SB and a timing signal CK. The stand-by SB signal for example, being a signal destined to assume two logic levels.

The reading voltage booster stage 4 is such as to supply the regulated reading voltage VRR with a value suited to the reading of the memory matrix 2 when it is selected.

Moreover, this reading voltage booster stage is destined to be put in a stand-by status, or rather to be deactivated, by the stand-by signal SB (for example, with a high logic level) and to be activated to function when the memory matrix 2 is selected (for example, the SB signal assumes the low logic level).

Preferably, from a structural point of view the stand-by voltage booster stage 5 is created in the same way as described in the abovementioned patent application EP-A-1113450 with reference to the stage indicated with the number 5.

The stand-by voltage booster stage 5 can be activated and deactivated to/from functioning on the basis of the stand-by signal SB.

Such stand-by voltage booster stage 5 has the function of maintaining, during the stand-by status, the output terminal 10 (together with the node 15) charged to a desired voltage value in order to enable the swift reading in output of a stand-by status and at the same time limiting consumption to that strictly necessary. In particular, the stand-by voltage booster stage 5 makes it possible to compensate the reduction of the electric potential of the output terminal 10 and the first node 15 that occurs in the stand-by status and due to leakage currents, or rather to the inverse junction saturation current pn or np of MOSFET transistors used in the memory system.

For the charging to a desired voltage of the output terminal 10 such a stand-by voltage booster stage 5, makes available a charging signal STBYPMPOUT supplied to a second node 103. In the same way as described in document EP-A-1113450, the stand-by voltage booster stage 5 comprises a voltage comparator, a phase generator, a positive charge pump booster and an optional auxiliary voltage regulator (not shown). A more detailed description of the stand-by voltage booster stage 5 is made in the document mentioned and is therefore not necessary in the present description.

The discharge management circuit 100 comprises a detection and discharge stage DT-DSC having an input terminal connected to the first node 15. The discharge management circuit 100 is also provided with means of commutation including a first high voltage switch or commutator 101 destined to connect/disconnect the first node 15 to/from the second node 103 in turn connected to a second high voltage switch 102. The second high voltage switch 102 is such to connect/disconnect the second node 103, also connected to the output of the stand-by voltage booster stage 5, at the output terminal 10.

The discharge management circuit 100 makes it possible, during memory stand-by 2, to discharge the first node 15 and, therefore, the filter capacitor 16 when the electrical potential of said first node 15 is higher in module than a desired value V-SB.

The desired value V-SB is a value such as assures that on exiting stand-by the voltage present on the output terminal 10 is suitable for performing a specific operation such as, in particular, the reading of a memory cell (for example, the voltage at the output terminal 10 is of 6V).

Moreover, as will be made clearer later, the discharge management circuit 100 makes it possible to discharge the first capacitor 16 in order to avoid perturbations of the output terminal 10 due to interactions between the first 16 and second 11 capacitor that can be checked when the first node 15 and the output terminal 10 are connected.

The detection and discharge circuit DT-DSC makes it possible to generate a first piloting signal PMPCONHV_N of the first high voltage commutator 101 and a second piloting signal REGCONHV_N of the second high voltage commutator 102.

Figure 2:
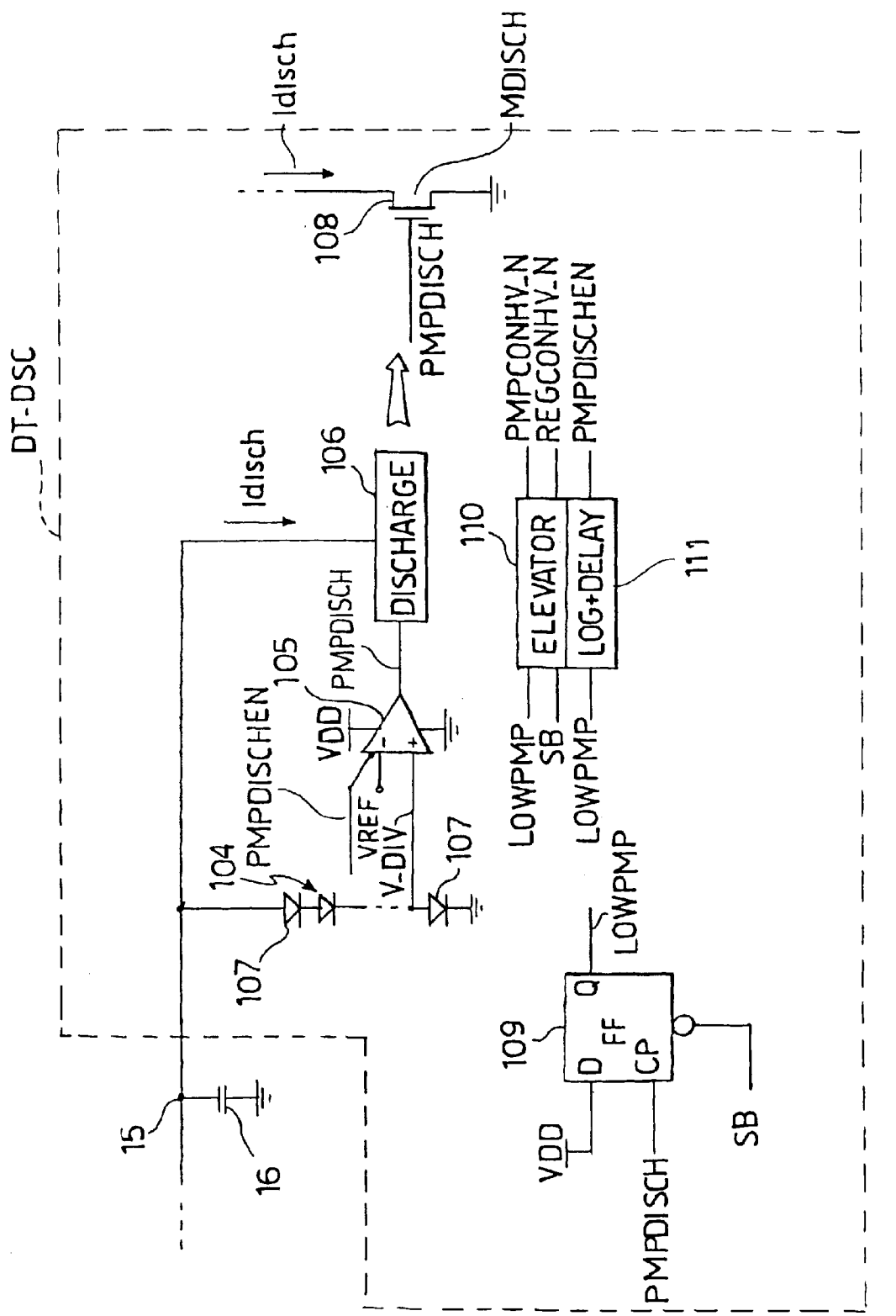

FIG. 2 schematically illustrates a preferred embodiment of the detection and discharge circuit, comprising a voltage divider 105 and a discharge device 106 (DISCHARGE).

The voltage divider 104 includes, for example, a number N2 of diodes 107 connected in series between the first node 15 and the ground in order to divide the output voltage from the positive charge pump booster 12 thus generating an output voltage V-DIV to be supplied to a non-inverting terminal of the voltage comparator 105.

The voltage comparator 105, supplied by a voltage VDD, is such to compare the voltage V-DIV withdrawn by the voltage divider 104 with a reference voltage VREF supplied to an inverting terminal and generate a discharge-command signal PMPDISCH in output. Moreover, the voltage comparator 105 is activated/deactivated by a logic activation signal PMPDISCHEN.

Advantageously, the activation signal PMPDISCHEN makes active the voltage comparator 105 (for example, by assuming a high logic level), when entry into stand-by occurs and deactivates it, thus reducing supply consumption, when the discharge device 106 has performed its discharge function or, if such a discharge function has not occurred completely, when the memory system 1 exits stand-by.

The discharge device 106, piloted by the command-discharge signal PMPDISCH, makes it possible to discharge to earth the voltage of the first node 15 until voltage is equal to the value V-SB.

For example, the discharge device is created by a MOSFET (Metal-Oxide-Semiconductor-Field-Effect-Transistor), in particular, at channel N, and represented in the same FIG. 2 by the discharge transistor 108.

Such a transistor 108 presents the gate terminal connected to the output of the voltage comparator 105, in such a way as to be activated and deactivated according to the discharge-command signal PMPDISCH, and the remaining terminals connected to the first node 15 and to the earth. During the discharge phase such a transistor 108 is crossed by Idisch discharge current. According to the example, the discharge takes place when the command-discharge signal PMPDISCH assumes a high logical level. It should be observed that, advantageously, the discharge caused is sufficiently fast as to not maintain the voltage comparator 105 in function too long and, at the same time, it is sufficiently slow to consent an efficient control by the voltage comparator 105.

Preferably, the voltage divider 104 is created in such a way that the diodes 107 are substantially equal to one another (in particular, they present the same threshold voltage ) and therefore in such a way that the voltage V-DIV withdrawn in output is equal to:

$$V\text{-}DIV = V\text{-}15/N2 \quad (1)$$

where V-15 is the voltage at the first node 15 and N2 is the number of the diodes 107.

By suitably choosing the value of N2 it is possible to ensure that the voltage V-DIV in output to the divider 104 is, in optimal operating conditions, equal to the reference voltage VREF.

Moreover, by suitably selecting the diode form factor 107 it is possible to minimize the consumption associated to the voltage divider 104. According to a particular embodiment, the voltage divider 104 can be created by a cascade of N2 P-type MOS transistors connected to a diode.

Preferably, such a voltage divider 104 is substantially identical to the voltage divider used in the stand-by voltage booster stage 5 and described in the abovementioned state of the art document. In this way, mismatching problems between the detection at the first node 15 and that at the output terminal 10 performed by the stand-by voltage booster stage 5 are reduced.

The detection and discharge circuit DT-DSC is also fitted with completed discharge signal LOWPMP generation stage 109 obtained starting from the command-discharge signal PMPDISCH.

In particular, such a generation stage 109 can be created using a flip-flop, FF, for example a type d model, synchronized by the command-discharge signal PMPDISCH applied to a CP input and such as to enable the flip flop 109 in correspondence with the descent fronts.

In this case the signal LOWPMP present on the output Q will assume the value VDD of the supply voltage applied at the input D each time a descent front of the command-discharge signal PMPDISCH is present. Flip-flop 109 reset occurs as a consequence to the exiting of stand-by status or rather, according to the example, when the stand-by signal SB assumes a low logic level.

The detection and discharge circuit DT-DSC also comprises a voltage booster 110 (also indicated in FIG. 2 with ELEVATOR) destined to invert and raise the voltage of the completed discharge signal LOWPMP and the stand-by signal SB generating on corresponding outputs, the first piloting signal PMPCONHV_N of the first high voltage commutator 101 and the second piloting signal REGCONHV_N of the second high voltage commutator 102 respectively.

The detection and discharge circuit DT-DSC is also provided with a suitable logic network 111 (indicated in the Figure with the caption LOG+DELAY) comprising, for example, an inverting element and, preferably also a delay element that assures a margin of safety in the times of the device 3.

The logic network 111 starting from the discharge completed signal LOWPMP is such to generate the activation signal PMPDISCHEN to send to the voltage comparator 105.

Figure 3:
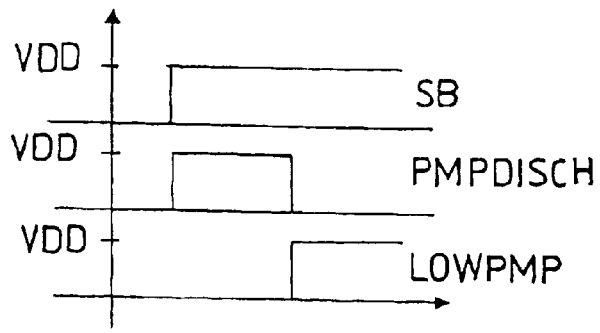

The operation of the memory system 1 will now be described in agreement with the invention also making reference to FIG. 3, in which particular stand-by signal SB trends of the command-discharge signal PMPDISCH and the discharge completed signal LOWPMP are shown.

When the memory system 1 is put in the stand-by status, the control unit 20 assigns to the stand-by signal SB the high logic level.

On entering the stand-by status, the first high voltage commutator 101 is kept open and the second high voltage commutator 102 is closed by the second piloting signal REGCONVH_N. In this way, during an initial phase, the output terminal 10 is connected to the stand-by voltage booster stage 5 whilst the first node 15, directly connected to the detection and discharge stage DT_DSC, is not connected with the stand-by voltage booster stage 5.

Moreover, initially the activation signal PMPDISCHEN is at a high logic level and such as to activate the operation of the voltage comparator 105.

The voltage divider 104 withdraws the voltage present at the first node and sends the corresponding voltage V-DIV to the voltage comparator 105.

If the voltage V-15 present at the first node 15 is higher than the preset value V-SB, and therefore the voltage V-DIV is higher than reference voltage VREF, the voltage comparator 105 generates the command-discharge signal PMPDISCH with a high logical level and sufficient to cause a discharge through the device 106.

In particular, the level of the command-discharge signal PMPDISCH is such to take to conduction the transistor 108 which, by means of the Idisch current discharges towards earth part of the charge of the filter condenser 16.

When, following the discharge made through the transistor 108, the voltage V-15 of the first output node 15 of the positive charge pump booster 12 is substantially equal to the value V-SB (and therefore, the voltage V-DIV is substantially equal to VREF), the command-discharge signal PMPDISCH reaches a logic level such as to interrupt the discharge of the first node 15.

The command-discharge signal PMPDISCH is also sent to the flip-flop 109. The descent front of the command-discharge signal PMPDISCH applied to the flip-flop 109 causes the activation (high logic level) of the discharge completed signal LOWPMP. As a consequence of the activation of the discharge completed signal LOWPMP, the network 111 takes the command-discharge activation signal PMPDISCHEN to a low logic level in order to deactivate the voltage comparator 105 from function. The deactivation of the voltage comparator 105 interrupts a further discharge of the node voltage 15 and, advantageously, prevents consumptions due to the voltage comparator itself.

The booster stage 110 inverts and boosts in voltage the discharge completed signal LOWPMP in order that the signal PMPCONHV-N assumes an adequate voltage level to close the first high voltage switch 101 by connecting the first node 15 to the terminal 10 and, therefore, to the stand-by voltage booster stage 5.

From this instant, the stand-by voltage booster stage 5 will see to maintaining the voltage of the output terminal 10, connected to the first node 15 and to the two respective capacitors 11 and 16, at the value V-SB charging it with the voltage STBYPMPOUT supplied to the second node 103.

The controlled discharge of the node 15 voltage and, therefore, of the filter capacitor 16, is particularly advantageous as is prevents the problems noted with conventional structures that provide, on entry to stand-by, an immediate connection, of the output node of the booster stage with the output terminal of the voltage regulator and, therefore, the connection of such common node with the stand-by voltage booster stage. In fact, in structures having a similar function to that of the booster device described in the document EP-A-1113450, it has been noted that one can present a duration of the permanence in stand-by status such as to not permit that one reaches the exhaustion of a transient due to the coupling or sharing between the filter capacitor connected to the booster and the decodification capacitor connected to the voltage regulator. It should be noted how on entry to the stand-by status the filter capacitor 16 and the decodification capacitor 11 present voltages V-16 and V-11 respectively.

In particular, it has been noted that in the presence of the enabling of the entire memory system signal (signal CE#, "Chip Enable") that is periodic with a period such as not to permit the exhaustion of the abovementioned transient there is a saturation of the output node of the voltage regulator to voltage values higher than the desired nominal reading value.

Such a saturation status makes vain the control action exerted by the stand-by voltage booster stage 5 and, in some cases, can lead to incorrect cell reading.

According to the invention, the voltage of the filter capacitor 16 is forced, on entering the stand-by status and before connecting the first node 15 to the output terminal 10, to assume the desired value V-SB without awaiting the exhaustion of the transient due to sharing with the decodification capacitor 11.

Thanks to the teachings of the invention, even in the presence of periodic and relatively high frequency enable signals of the memory system 1 it is possible to ensure that the output terminal 10 presents, on exit from stand-by, the voltage value V-SB desired and suitable for reading and that, on the other hand, it does not assume values that are not pre-settable and such as to compromise cell reading.

For completeness of description, preferential embodiments of the voltage divider 104, of the voltage comparator 105 and of a commutation structure that can be used in the creation of the first 101 and the second 102 high voltage commutator will be described.

It should be pointed out that in the present description and in the corresponding figures, identical or similar elements are indicated with the same reference numbers.

Figure 4:
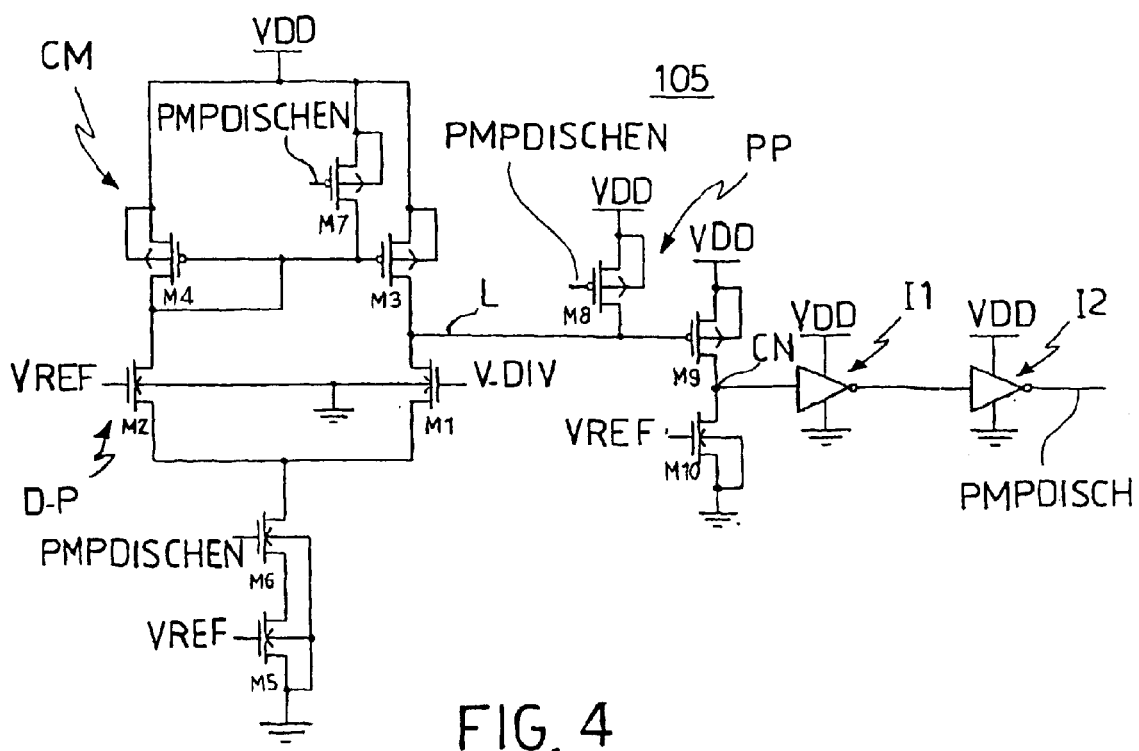

FIG. 4 illustrates a preferred embodiment of the voltage comparator 105. According to the embodiment shown in FIG. 4 the voltage comparator is created in CMOS (Complementary Metal-Oxide-Semiconductor) technology and includes MOS transistors.

This voltage comparator 105 comprises a differential amplifier D-P including a pair of transistors (of type N) M1 and M2 and an active charge including a current mirror CM formed by two transistors (of type P) M3 and M4.

At the gate terminals of transistors M1 and M2 of the differential amplifier D-P can be supplied the voltage V-DIV exiting from the voltage divider 104 and the reference voltage VREF respectively. The source terminals of the transistors M1 and M2 are both connected to the drain of a first activation/deactivation transistor (of type N) M6 destined to receive the activation signal of the voltage comparator PMPDISCHEN at its gate.

The first activation/deactivation transistor is connected in cascade with a transistor M6 (of type N) connected to the earth and having the respective gate terminal destined to receive the reference voltage VREF that takes it to conduction.

The source terminals of the transistors M3 and M4 forming the current mirror CM are connected to the supply voltage VDD. Between the terminal supplied by the voltage VDD and the common gate terminals of transistors M3 and M4 of the current mirror CM a second activation/ deactivation transistor (of type P) M7 is interposed, to the gate of which the voltage comparator activation signal PMPDISCHEN is applied.

The drain terminal of the transistor M1 of the differential amplifier D-P is connected to an output line L on which, when the voltage comparator is activated, a signal correlated to the difference in the output voltage of the voltage divider V-DIV and the reference voltage VREF is made available. At the output line L a third activation/deactivation transistor (of type P) M8 supplied by the voltage VDD and such as to receive in entry the activation signal PMPDISCHEN is connected. According to the example in FIG. 4, the output line L is connected to an intermediate stage PP including a higher P-type transistor, M9, connected in cascade to a lower N-type transistor, M10, having a terminal connected to ground. The line L is connected to the gate of the upper transistor M9, and the lower transistor M10 receives at its gate the reference voltage VREF.

A common node CN of the upper and lower transistors is connected at the input to a first inverter I1 in turn connected to a second inverter I2 on whose output a command-discharge signal PMPDISCH is made available.

As is evident to a branch technician, when the activation of the voltage comparator signal PMPDISCHEN assumes a high logical level, the voltage comparator 105 is activated to function whereas, when the signal assumes a low logic level the first activation transistor M6 is deactivated and the second activation transistor M7 is activated to function in such a way as to deactivate the transistor M3 of the current mirror CM.

Moreover, when the voltage comparator activation signal PMPDISCHEN is at a low logic level, the third activation transistor M8 is activated to function in order to take the output line L to voltage VDD (high level) and deactivate the upper transistor M9. In this way, by means of the lower transistor M10, a voltage such that at the output of the second inverter I2 the command-discharge signal PMPDISCH assumes a low logic level, that does not consent the discharge to be made, is taken to the input of the first inverter I1.

Considering now the voltage comparator 105 in an active state, when the voltage V-DIV in output from the voltage divider 104 is higher than the voltage VREF, on the output line L of the differential amplifier D-P a signal such as to deactivate the upper transistor M9 of the intermediate stage PP from functioning is present. In this way, a signal is taken to the input of the first inverter I1 such that on output from the second inverter I2, the command-discharge signal PMPDISCH will assume a high logic level, that makes it possible for discharge to be made.

Figure 5:
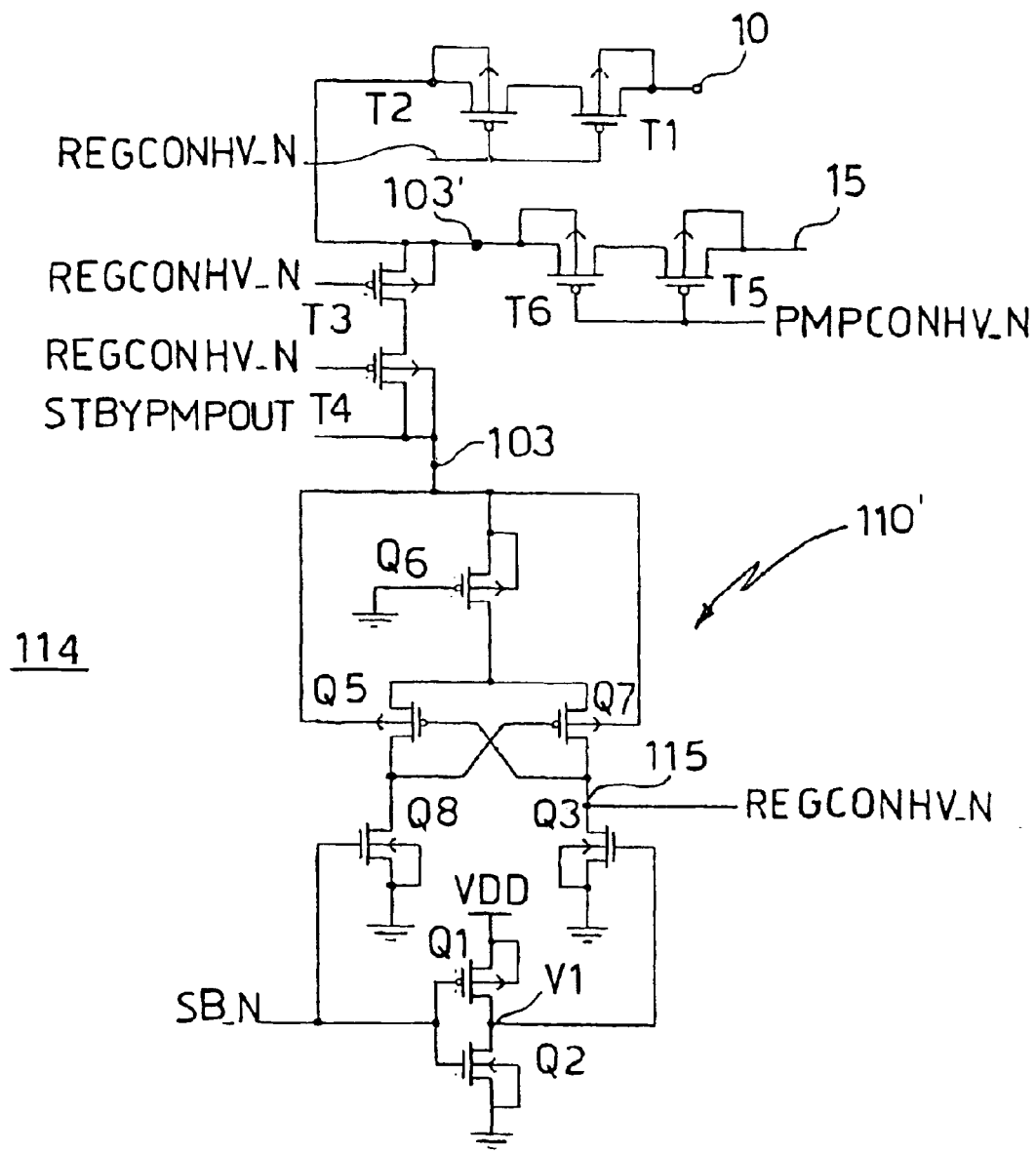

FIG. 5 illustrates an example of an electronic circuit 114, in particular, in CMOS technology that can be used to create the functions performed by the high voltage 101 and 102 and for the generation of the second piloting signal REGCONHV_N.

The circuit 114 comprises four first transistors (of type P) T1, T2, T3 and T4 connected in series to one another and interposed between the output terminal 10 of the voltage regulator 17 and the second node 103 to which the output line STBYPMPOUT of the stand-by voltage booster stage 5 is connected.

Of said first transistors T1, T2, T3, T4 perform the role of the second high voltage commutator 102 and are such as to be able to receive at the respective gate terminals the second piloting signal REGCONHV_N in order to be activated/ deactivated to/from conduction on the basis of the level assumed by the second piloting signal itself.

When the first transistors T1, T2, T3, T4 are activated to conduction (commutator 101 in the closed status) the output terminal 10 is connected to the second node 103 and therefore can receive the voltage generated by the stand-by voltage booster stage 5.

Moreover the circuit 114 comprises second transistors T5 and T6 (of type P) connected in series with one another and interposed between the first node 15 and a second node 103' connected selectively to the second node 103 that receives the STBYPMPOUT signal. Such second transistors T5 and T6 perform the functions of the first high voltage commutator 101 and the respective gate terminals are such as to receive the first piloting signal PMPCONHV_N.

When such second transistors T5 and T6 are activated to conduction by the suitable level of the first piloting signal PMPCONHV_N, the first node 15 is put into connection with the third node 103' and, if the first transistors T3 and T4 are activated, also with the second node 103.

The circuit 114 in FIG. 5, also illustrates a booster stage 110' that starting from a signal SB_N obtained by denying the stand-by signal SB generates the second piloting signal REGCONHV_N.

This voltage booster stage is in itself conventional and is therefore made clear to branch experts by FIG. 5.

However, the booster stage 110' comprises an inverter including a P-type transistor Q1 and an N-type transistor Q2 destined to receive on the respective gate said signal SB_N and to supply on an output U1 an inverted logic signal that pilots an output N-type transistor Q3. The output transistor Q3 is connected to an output node 115 of the booster stage 110' destined to make available the second piloting signal REGCONHV_N. This node 115 is connected to the gate terminal of a P-type transistor Q5 in turn connected to a second node 103 by a P-type transistor Q6.

The node 115 is also connected to a transistor Q7 piloted from the output of a transistor Q8 such as to receive the signal SB_N at the gate terminal. The transistors Q2 and Q7 present a conventional latch connection.

When the signal SB_N is of a low logic level (active stand-by signal SB) the inverter Q1-Q2 supplies on the output U1 a high logic level signal that activates to conduction the output transistor Q3 that connects the node 115 to earth. In such conditions, the signal REGCONHV_N assumes a voltage value substantially equal to the earth voltage.

Conversely, if the signal SB_N is of a high logic level (stand-by signal SB deactivated) the output transistor Q3 is deactivated from the low logic level output of the inverter Q1-Q2.

The node 115 is taken substantially to the voltage of the second node 103 by the transistor Q6 and transistor Q7, the latter activated to conduction by the low logic level signal exiting from transistor Q8. Therefore, the second high voltage signal REGCONHV_N, in other words with a voltage value substantially equal to that of the signal STBYPMPOUT is made available on the node 115.

Figure 6:
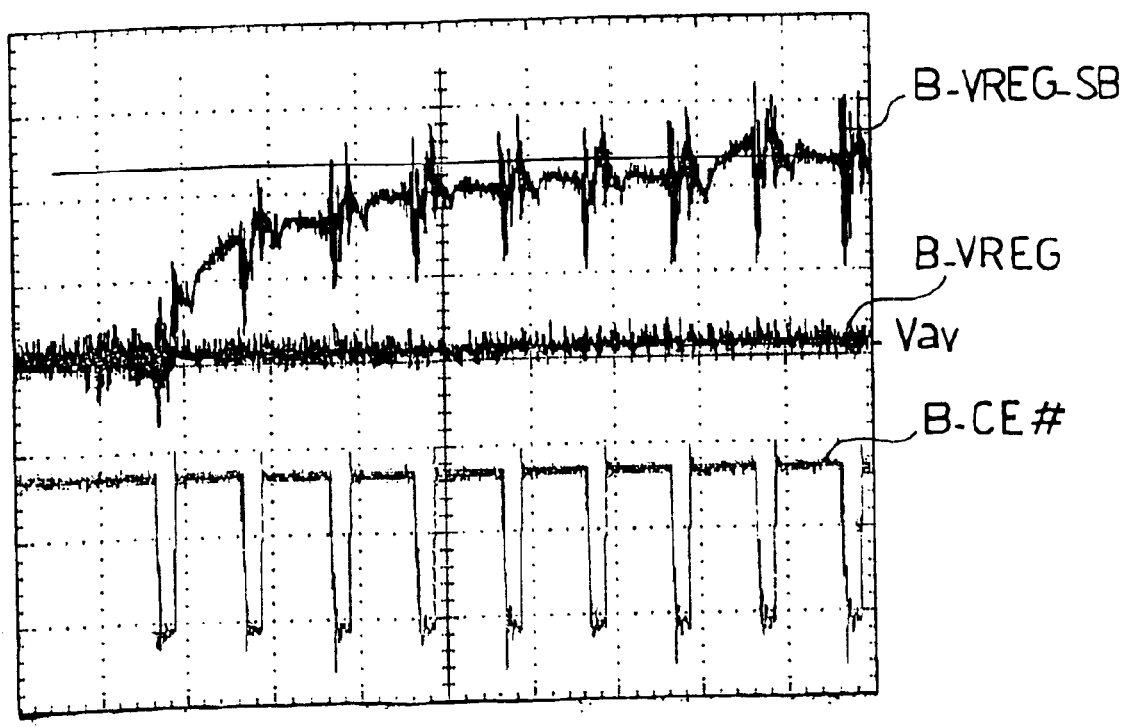
FIG. 6 illustrates the result of experimental measurements relating to a conventional voltage booster device.

FIG. 6 illustrates certain results of experimental measurements made with reference to a conventional type device such as that described by the abovementioned patent application EP-A-1113450.

The B-VREG curve represents the trend in time of the voltage regulator's output terminal voltage during function in normal operating conditions such as, for example, the reading of the cell 2. In FIG. 6, the B-VREG curve is substantially arranged around a voltage value Vav equal to 6V, suitable for the reading of memory cells.

The B-CE# curve represents the temporal trend of a chip enable signal CE# of a periodic type, with period of 1 μs, and duty-cycle (index of use) equal to 20% that selects (CE# low) or disables (CE# high) the memory matrix 2. The B-CE# curve represents a signal such as to not consent the exhaustion of the transient between the filter capacitor on output to the booster and the decodification capacitor in output to the voltage regulator.

The B-VREG-SB curve shows the trend of the voltage regulator's output terminal voltage during stand-by cycles in agreement with the trend of the enable signal CE#. As is shown by observing the curve B-VREG-SB, the voltage on the output terminal during stand-by in relation to the value Vav and, when exiting the stand-by status it is not able to return to the value Vav. Moreover, after a certain number of enabling signal cycles CE# (approximately 9 cycles per second according to the cycle) the voltage at the regulator's output terminal reaches a saturation value which in the example in the drawing is equal to approximately 6.4 V.

As mentioned previously, this saturation can be explained with the fact that in the conventional device the exhaustion of the transient between the filter capacitor and that of decodification is not consented.

Figure 7:
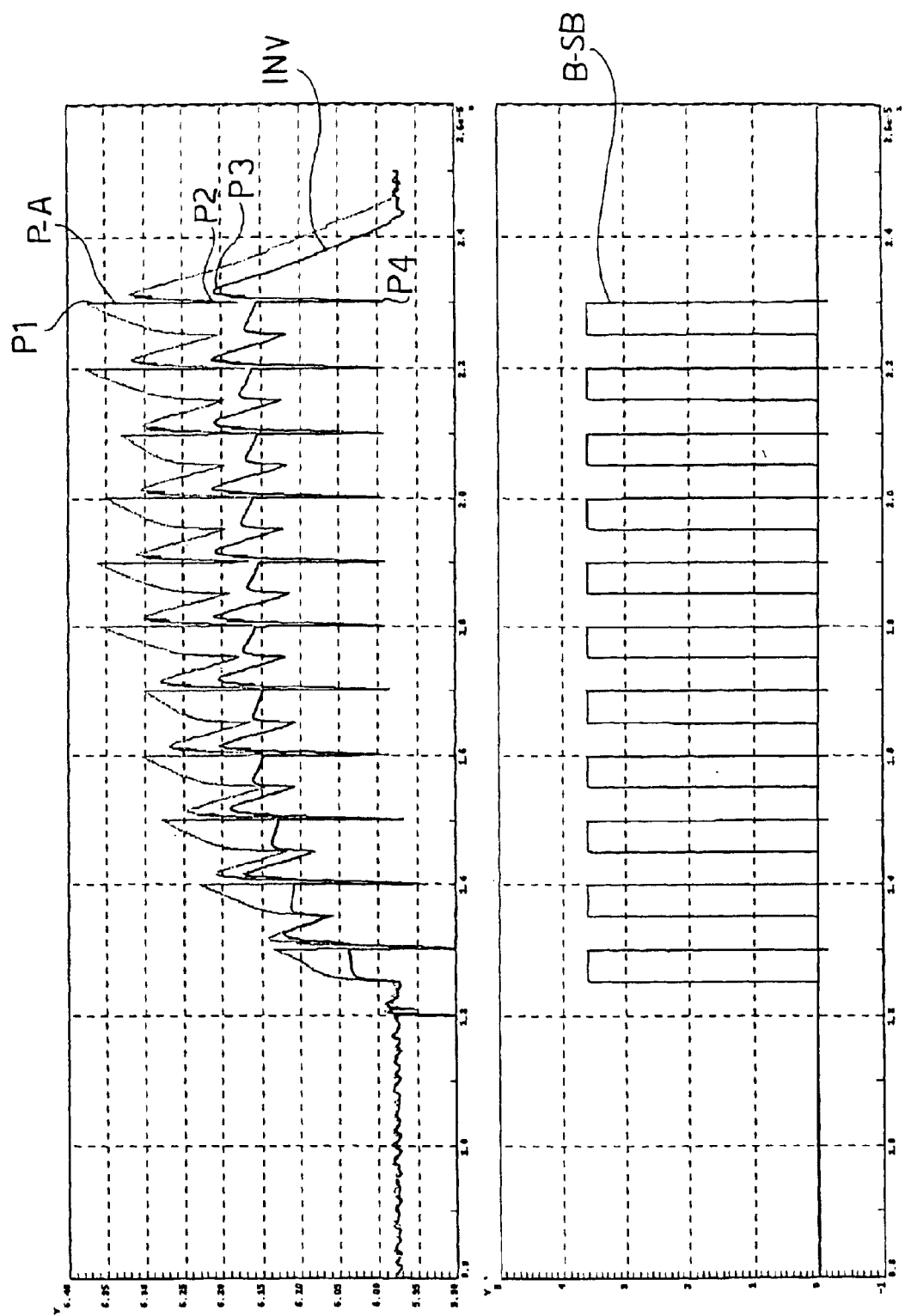
FIG. 7 illustrates the result of comparison simulations between a conventional booster device and one created in agreement with the invention.

FIG. 7 illustrates comparison simulations between the behavior of a conventional device similar to that that produced the curve in FIG. 6 with a device created according to the invention.

The B-SB curve shows the trend in time of a stand-by signal (voltage in Volt versus seconds) having the function of the SB signal previously described and having a periodic, high frequency behavior and in other words particularly critical.

The P-A curve illustrates the trend of the voltage regulator's output terminal voltage as a consequence of the variations of the B-SB curve for a conventional device.

The INV curve illustrates the trend of the voltage of the output terminal 10 in correspondence with the signal shown with the B-SB curve in a memory system of a similar type to the system 1 described previously.

It is evident that the INV curve remains below the P-A curve. The P-A curve reaches a peak value equal to approximately 6.4 V (see, for example, the peak P1 in FIG. 7).

Moreover, when one exits the stand-by status the P-A curve drops to a value equal to approximately 6.18 V (see, for example, the downward peak of the stretch of the curve indicated with P2). This value of 6.18 V is too high in relation to the optimal reading value that, according to the example, is of 6 V and, therefore, it is the cause of an incorrect reading.

However, in the same operating condition, the INV curve reaches a peak value equal to approximately 6.21 V (see, for example, peak P3) and, on exiting stand-by this value drops to less than 6V in other words, it reaches a value that assures a correct reading (see point P4).

It should also be observed that, advantageously, in other operative conditions, less critical than that shown, the invention system does not reach saturation whereas saturation can occur for conventional memory systems.

We now refer to the functioning of the memory system 1 on return from a stand-by status, in other words at the operative condition in which the stand-by-status ceases and the memory matrix 2 is selected for an operation, for example, of reading.

In particular, consider the case in which the memory system 1 remains in stand-by for a sufficiently long period of time that intermediate stages of the positive charge pump booster 12 are at electrical potentials lower than or equal to the supply voltage VDD. When the memory system 1 is enabled again, the positive charge pump booster 12 takes a certain number of clock pulses to reach regime.

For correct functioning on exit from stand-by a static current Idc to supply the voltage regulator 17 or rather, a static current along the conduction line 15' at least is required.

As the positive charge pump booster 12 takes a certain period of time to reach regime the voltage present at the output terminal 10 can discharge, in other words diminish, dropping below the nominal reading value, thus hindering the correct function of the memory system.

One must also observe that filter capacitor 16 is not designed to compensate this delay of the booster 12 and therefore does not make it possible to supply electric charge starting from which one can sustain the static current Idc.

Such a situation is all the more critical the smaller the supply voltage VDD of the memory system 1, in virtue of the fact that the voltage boosting action on the condensers (not shown) typically included in the charge pump booster 12 is less efficient.

Moreover, it has been observed that in the stages following re-entry from stand-by, the positive charge pump booster 12 requires a current even greater that the static current Idc required by the voltage regulator 17 alone. In fact, it should be noted that, in addition to the static current $I_{dc}$, a transitory current $I_{WL}$ is required.

The transient current $I_{WL}$ is a function of the electric charge required to charge one or more word lines 7 addressed in consequence of the single accesses to the memory matrix or multiple accesses to the same. Each word line 7 constitutes a charge for the voltage regulator 17.

In greater detail, such transient current $I_{WL}$ is given by the following expression:

$$I_{WL} = C_{WL} \cdot V_{GR} / \Delta T_{WL} \quad (2)$$

where $C_{wl}$ is the capacity associated to the word-line, VGR is the reading gate voltage and $\Delta T_{WL}$ is the time necessary to charge the word-line.

In normal operating conditions, for example during a reading, the static current $I_{dc}$ and the transient current $I_{WL}$ are supplied by the positive charge pump booster 12, which makes it possible to maintain the filter capacitor 16 at a nominal voltage value V-GP.

On the other hand, it has been observed that, on re-entry from a stand-by phase, the filter capacitor 16 is charged to a stand-by voltage V-SB lower than a nominal value V-GP and moreover this capacitor is not charged instantly by the charge pump booster 12.

Therefore, for a certain period of time $\Delta T_{DEL}$, depending on operating conditions (operating temperature and supply voltage), the positive charge pump booster 12 is not able to supply the necessary electric charge for the currents $I_{dc}$ and $I_{WL}$. As a consequence, the static current $I_{dc}$ and transient current $I_{WL}$ discharge the filter capacitor 16 below the reading gate voltage of a quantity of $\Delta V_{DISCH}$ equal to:

$$\Delta V_{DISCH} = V_{SB} - V_{FIN} = V_{OUT,SB} - \frac{\Delta T_{DEL} \cdot I_{dc}}{C_{16}} - n * \frac{\Delta T_{WL} \cdot I_{WL}}{C_{16}} \quad (3)$$

where n is the number of word-lines that can be addressed in the time $\Delta T_{DEL}$, and $V_{FIN}$ is the voltage at the first node 15 at the end of this undesired discharge. The time $\Delta T_{DEL}$ can be equal to 500 ns in particularly critical cases such as, for example, cases in which the supply voltage VDD is 2.5 V and the temperature reaches 90° C.

The charge quantity Q to compensate is therefore:

$$Q = \Delta T_{DEL} I_{dc} + n \Delta T_{WL} I_{WL} \quad (4)$$

With reference to the matters indicated above, advantageously, the memory system 1 shown in FIG. 1 can comprise additional means of voltage boosting.

According to a first embodiment, such additional means of voltage boosting can comprise an additional positive charge pump booster 112, F-RECH, of a type such as to consent a rapid reactivation on re-entry from stand-by and dimensioned in such a way as to supply the quantity of Q required and quantifiable by the equation (4) at the first node 15.

For example, a rapid activation booster is a booster able to supply the electric charge Q in 500 ns. Such a type of rapid activation booster is available in commerce.

On entry to the additional booster 112 an enabling/disabling signal EN is applied that makes it possible to deactivate it after an interval of time equal to approximately the time $\Delta T_{DEL}$.

FIG. 8 illustrates an example of additional means of voltage boosting 113 that can be used in alternative to the additional charge pump booster 112.

The additional means 113 comprises elements for supplying electric charge or, in short, "boosters" including piloting elements connected to compensation condensers. In greater detail, the means 113 include a piloting element B1, such as a conventional inverter, connected on output to a first boost capacitor CB-dc and to a second boost capacitor CB-WL1 both also connected to the first node 15. In particular, the said boost capacitors present an upper plate connected to the first node 15 and a lower plate connected to the output of the inverter B1 in order to be piloted.

Such inverter B1 and, therefore, the first capacitor CB-dc are dimensioned in order to compensate the abovementioned static current Idc. Moreover, the inverter B1, fitted with the second capacitor CB-WL1, can also supply a first contribution to the transitory current $I_{WL}$. The inverter B1 is such as to receive in input a corresponding command signal BST1#.

Moreover, the additional voltage boosting means 113 in FIG. 8 comprise further inverters B2–Bn having corresponding outputs connected to the respective boost capacitors CB2-WL2–CBn-WLn connected to the first node 15 that supply contributions to the transient current $I_{WL}$. The further inverters B2–Bn can receive respective input signals BST1#–BSTn#.

The inverter B1 and the further inverters B2–Bn are supplied by a supply voltage VB equal, for example, to that supply VDD of the voltage booster device 3. Alternatively, the supply voltage VB can be generated by an additional regulation circuit supplied, for example, with the same voltage VDD or with a voltage generated on purpose. For the supply of the inverters B1–Bn different supply voltages can be used.

The same FIG. 8 illustrates an example of the command signals BST1#–BSTn# times as a consequence of the stand-by signal SB and the addressing signals ADD of the memory array cells 2.

According to the example in FIG. 8, on exiting stand-by (the SB signal has assumed a low logic level)and in the presence of a first address ADD, the command signal BST1# assumes a logic level (for example, low) such as to pilot, by means of the inverter B1, the first capacitor CB-dc and the second capacitor CB-WL1. In this way, there will be a redistribution of the electric charge between these capacitors CB-dc and CB-WL1 and the filter capacitor 16 in such a way as to provide the charge Q required for the static current $I_{dc}$ and for the transitory current required for this first addressing, in other words, relative to the particular word-line addressed.

In this phase, the other inverters B2–Bn pilot the other capacitors CB-WL2 and CB-WLn so that they do not supply electric current.

When a change of address occurs in other words, a commutation of the address signal ADD, the command signal BST2# (which assumes a low logic level)is activated thus ensuring that the further inverter B2 pilots the capacitor CB-WL2 in such a way as to provide the necessary transitory current to the other addressing. Similar considerations can be made for the signal BSTn# and for the inverter Bn.

The command signals BST1#–BSTn#, after the time $\Delta T_{DEL}$, are given with times suitable to levels such as to allow that the positive charge pump booster 12, once it reaches regime, can charge the capacitors CB-dc and CB-WL1–CB-WLn.

FIGS. 9*a* and 9*b* show the results of simulations made for a voltage booster device that does not use the additional means of voltage boosting (FIG. 9*a*) and for a device of the type of device shown in FIG. 8 including two inverters B1 and B2 with the abovementioned respective capacitors and supplied with a voltage VB=VDD.

The simulations were performed with reference to a situation of high temperature and low supply voltage that is therefore particularly critical.

FIG. 9*a* illustrates with the ATD curve the trend of an activation signal of access to the memory matrix (normally denominated Address Transition Detector) generated when a change of address and/or a descent of the CE# signal occurs.

The IN-REG1 and OU-REG1 curves illustrate the trend of the supply voltage (such as that supplied to the first node 15) of the voltage regulator and the trend of the output voltage of the voltage regulator 17 (such as that supplied to the output terminal 10) respectively.

From FIG. 9*a* one observes the drop in voltage (indicated with an arrow F1) that presents at the first node 15 and at the output terminal 10 according to the state of the art.

Referring to FIG. 9*b*, the IN-REG2 and OU-REG2 curves illustrate the supply voltage (such as that supplied to the first node 15) of the voltage regulator 17 and the trend of the output voltage of the voltage regulator 17 (such as that supplied to the output terminal 10)respectively.

From the FIG. 9*b* it appears clear how the voltage present at the first terminal 15 (IN-REG2) does not present a decrease in module, but, on the contrary, it shows a voltage peak indicated by an arrow F2. Moreover, one can observe how, advantageously, the voltage supplied to the output terminal 10 and therefore to the word-lines 7 (OU-REG2) does not present the undesired phenomenon of drop in module.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A voltage booster device comprising:
    a first terminal being connectable to a respective electric potential and associated to a first capacitor,
    a second terminal being connectable to a second capacitor and selectively connectable to the first terminal,
        a discharge circuit coupled to the first capacitor for reducing the electric potential of the first terminal, the discharge circuit means being activated to function when said device is in the stand-by status and the second terminal is disconnected from said first terminal.

2. The device according to claim 1 wherein said discharge circuit makes it possible to discharge the first capacitor in order to avoid perturbations of said second terminal due to interactions between the first and second capacitor that can occur when the first and second terminals are connected.

3. The device according to claim 1 wherein said discharge circuit comprises:
    a discharge device connectable to said first terminal to cause a discharge current of the first capacitor when the said electric potential is higher than a preset value, the discharge device being enablable/disableable by means of a first command signal.

4. The device according to claim 3 wherein said discharge circuit also comprises:
    a detection circuit to generate the first command signal of the discharge device starting from a first voltage correlated to the electrical potential of the first terminal.

5. The device according to claim 4 wherein said detection circuit comprises:
    a voltage comparator for comparing the first voltage with a reference voltage, said voltage comparator supplying as an output the first command signal.

6. The device according to claim 5 wherein the detection circuit comprises:
    a voltage divider connected to said first terminal to provide said first voltage to the voltage comparators.

7. The device according to claim 4 wherein said discharge device includes a MOSFET having a control terminal connected to said detection circuit for receiving the first command signal.

8. The device according to claim 1, comprising:
    a booster stage connected to said first terminal in order to supply the electric potential greater than a supply voltage of the device.

9. The device according to claim 8, also comprising:
    a voltage regulator stage connected to the booster stage in the active status in order to receive said electric potential and to supply an operative voltage on the second terminal.

10. The device according to claim 9, also comprising:
    additional voltage booster means of said first terminal when said device is taken into the active status after a period in the stand-by status and for a preset interval of time, said additional means supplying to the first terminal electric charge in order to compensate an initial absorption of current from said first capacitor that occurs on entry into the active status.

11. The device according to claim 10 wherein said additional means are such to supply electric charge in order to support at least one static supply current of said voltage regulator stage.

12. The device according to claim 10 wherein said additional means are such to supply at least one transient current in order to compensate a transient current absorption by a charge that can be connected to said second terminal of the voltage regulator stage.

13. The device according to claim 10 wherein said additional means comprise an additional charge pump booster of the rapid activation type.

14. The device according to claim 10 wherein said additional means comprise a first piloting element connected to at least a first compensation capacitor connected to the first terminal, said first capacitor being piloted by said first piloting element in order to supply electric charge starting from which is obtainable at least one static current.

15. The device according to claim 14, also comprising a second compensation capacitor associated to said first compensation capacitor piloted by said first piloting element in order to supply electric charge from which a transient current is obtainable.

16. The device according to claim 15 wherein said additional means include at least one second piloting element connected to at least one third compensation capacitor in such a way as to supply electric charge in order to support a further transient current and compensate an absorption of current by part of a further charge connected to said second terminal.

17. The device according to claim 1, also comprising:

a voltage booster stage in order to raise in voltage the second terminal when the device is in the stand-by status and the first and second terminal are disconnected.

18. The device according to claim 17 wherein the voltage boost stage also makes it possible to raise in voltage the first terminal connected to the second terminal when, in the stand-by status, the said discharge circuit is deactivated.

19. The device according to claim 1 provided with at least one input for receiving a second command signal to take the device into the stand-by status or into the active status.

20. The device according to claim 19 wherein the discharge circuit comprises:

a commutation means destined to electrically connect/disconnect the first terminal to/from the second terminal, said means of commutation being commanded by at least one piloting signal of commutation.

21. The device according to claim 20 wherein said discharge circuit also comprises at least one circuit for the generation of said at least one piloting signal of commutation starting from said second command signal and from a signal representative of the reduction of said electric potential following discharge of the first capacitor.

22. Non-volatile memory system comprising:

a matrix of memory cells organized in rows and columns, a voltage booster device for boosting a supply voltage and supplying an operative voltage to said memory matrix, said voltage booster device being constructed according to claim 1.

* * * * *